United States Patent
Rieh et al.

(10) Patent No.: US 11,205,534 B2
(45) Date of Patent: Dec. 21, 2021

(54) ULTRA LOW POWER TRANSIMPEDANCE AMPLIFIER BASED ON SPINTRONICS

(71) Applicant: KOREA UNIVERSITY RESEARCH AND BUSINESS FOUNDATION, Seoul (KR)

(72) Inventors: Jae-Sung Rieh, Seoul (KR); Kyung Jin Lee, Seoul (KR); Do Yoon Kim, Suwon-si (KR); Jae Hyeon Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/891,554

(22) Filed: Jun. 3, 2020

(65) Prior Publication Data

US 2020/0388424 A1 Dec. 10, 2020

(30) Foreign Application Priority Data

Jun. 4, 2019 (KR) .......................... 10-2019-0066055

(51) Int. Cl.
*H03F 3/191* (2006.01)
*H01F 10/32* (2006.01)
*H03F 3/45* (2006.01)

(52) U.S. Cl.
CPC ..... *H01F 10/3254* (2013.01); *H03F 3/45475* (2013.01); *H03F 2200/129* (2013.01); *H03F 2203/45116* (2013.01); *H03F 2203/45528* (2013.01)

(58) Field of Classification Search
CPC ................................. H03F 3/191; H03F 3/187
USPC ................................................... 330/306, 307
See application file for complete search history.

(56) References Cited

U.S. PATENT DOCUMENTS

| 4,729,129 A * | 3/1988 | Koerner | H03G 3/3042 330/207 P |
|---|---|---|---|
| 8,811,917 B2 * | 8/2014 | Kim | H03F 1/3258 455/114.3 |
| 2007/0196113 A1 | 8/2007 | Fathimulla et al. | |
| 2018/0126010 A1 * | 5/2018 | Turin | A61B 5/055 |

OTHER PUBLICATIONS

Azim et al., "Buffered Spin-Torque Sensors for Minimizing Delay and Energy Consumption in Global Interconnects," IEEE Magnetics Letters, vol. 8 (2017), 5 pages in English.
Woo., "Spintronics based ultra low power ultra high speed communication device for all Internet," Convergence Research Policy Center, Mar. 19, 2018, (1 page in English, 10 pages in Korean).

* cited by examiner

*Primary Examiner* — Henry Choe
(74) *Attorney, Agent, or Firm* — NSIP Law

(57) ABSTRACT

Disclosed is an ultra low power transimpedance amplifier based on spintronics. According to the present invention, provided is an ultra low power transimpedance amplifier based on spintronics, which includes: a spintronics based oscillator receiving current and outputting an alternating signal by using spin transfer torque or spin orbit torque; a bandpass filter passing a signal in a predetermined frequency band of the alternating signal output by the spintronics based oscillator; and a spintronics based detector outputting voltage by inputting the signal in the predetermined frequency band, which is output by the bandpass filter.

5 Claims, 2 Drawing Sheets

ULTRA LOW POWER TRANSIMPEDANCE AMPLIFIER BASED ON SPINTRONICS

CROSS REFERENCE TO RELATED APPLICATION

This application claims the benefit under 35 USC § 119(a) of Korean Patent Application No. 10-2019-0066055 filed on Jun. 4, 2019, in the Korean Intellectual Property Office, the entire disclosure of which is incorporated herein by reference for all purposes.

BACKGROUND

Technical Field

The present invention relates to an ultra low power transimpedance amplifier based on spintronics.

Background Art

A transimpedance amplifier is a unit circuit that receives an input signal as a current signal and converts the current signal into a voltage signal. The transimpedance amplifier is a kind of amplifier that is frequently used for optical communication and is mainly used for the purpose of converting output current of a photodetector into voltage and connecting the voltage to a rear stage.

FIG. 1 is a diagram illustrating a transimpedance amplifier in the related art.

As illustrated in FIG. 1, resistance $R_f$ is connected to the transimpedance amplifier 100 in the related art and a current signal $I_{in}$ input into a first input terminal is converted into a voltage signal $V_{out}$ to be output.

The transimpedance amplifier in the related art has a disadvantage in that power consumption is large and a swing of an output terminal is limited to $V_{DD}$ of the amplifier.

Further, there is a problem in that there is a trade-off relationship in which a transimpedance gain is in proportion to an RF and a bandwidth is in inverse proportion to the RF.

PRIOR ART DOCUMENT

Patent Document

U.S. Laid-open Patent Publication No. U.S. 2007-0196113

SUMMARY OF THE DISCLOSURE

In order to solve the problems in the related art, the present invention has been made in an effort to propose an ultra low power transimpedance amplifier based on spintronics, which may be small in power consumption and solve a trade-off problem between an operation bandwidth and an amplification gain.

In order to achieve the object, according to an exemplary embodiment of the present invention, provided is an ultra low power transimpedance amplifier based on spintronics, which includes: a spintronics based oscillator receiving current and outputting an alternating signal by using spin transfer torque or spin orbit torque; a bandpass filter passing a signal in a predetermined frequency band of the alternating signal output by the spintronics based oscillator; and a spintronics based detector outputting voltage by inputting the signal in the predetermined frequency band, which is output by the bandpass filter.

The spintronics based oscillator may include a fixation layer, an insulation layer, and a free layer having a spin direction difference of θ from the fixation layer, and output the alternating signal through current vertically or horizontally applied to the free layer.

The spintronics based oscillator may output the alternating signal by using the spin transfer torque when the current is vertically applied to the free layer.

The spintronics based oscillator may output the alternating signal by using the spin orbit torque when the current is horizontally applied from an electrode made a heavy metal connected to the free layer.

The spintronics based detector may include a fixation layer, an insulation layer, and a free layer having a spin direction difference of θ from the fixation layer, and output voltage for input current according to the following equation.

$$V_{READ} = I * R(\theta) \qquad \text{[Equation]}$$

In the spintronics based detector, the bandpass filter may be set to operate in a frequency band output when bias current and input current are simultaneously applied to the spintronics based oscillator.

According to an exemplary embodiment of the present invention, it is advantageous in that power consumption can be small and efficient amplification is possible.

Furthermore, according to the exemplary embodiment of the present invention, a trade-off relationship between an amplification degree and a bandwidth in the related art can be removed.

DETAILED DESCRIPTION

Figure 1:
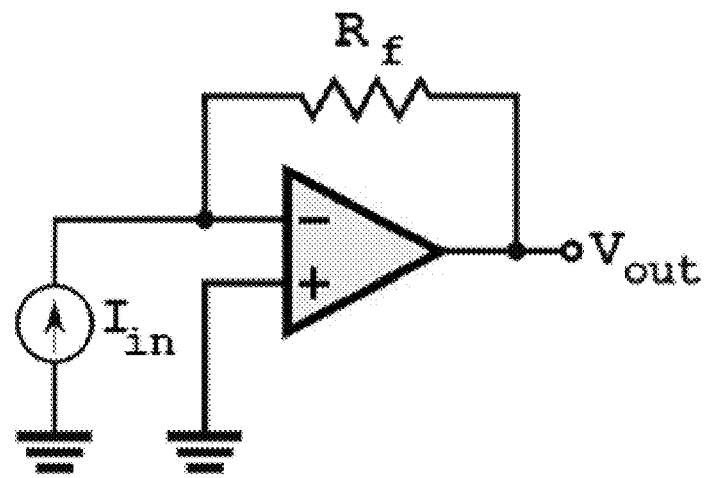
FIG. 1 is a diagram illustrating a transimpedance amplifier in the related art.

The present invention may have various modifications and various exemplary embodiments and specific exemplary embodiments will be illustrated in the drawings and described in detail.

However, this does not limit the present invention to specific exemplary embodiments, and it should be understood that the present invention covers all the modifications, equivalents, and replacements included within the idea and technical scope of the present invention.

Figure 2:
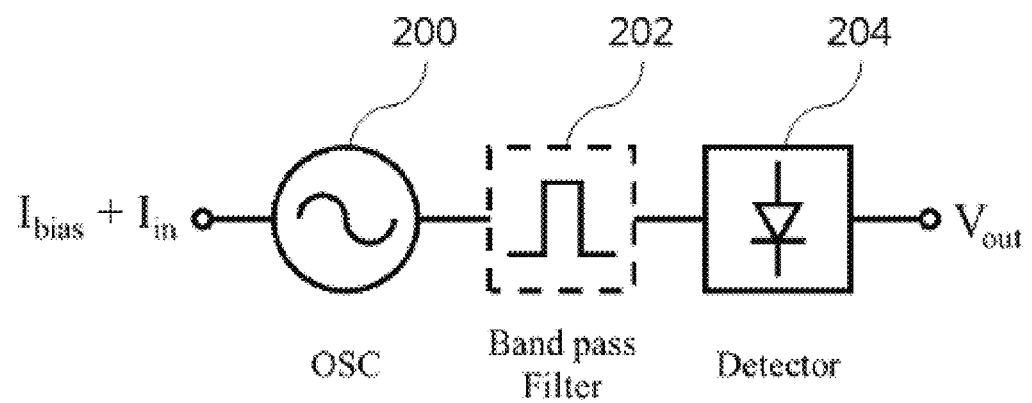
FIG. 2 is a diagram illustrating a configuration of an ultra low power transimpedance amplifier based on spintronics according to an exemplary embodiment of the present invention.

FIG. 2 is a diagram illustrating a configuration of an ultra low power transimpedance amplifier based on spintronics according to an exemplary embodiment of the present invention.

As illustrated in FIG. 2, the transimpedance amplifier according to the exemplary embodiment may include a spintronics based oscillator 200, a bandpass filter 202, and a spintronics based detector 204.

The spintronics includes spin transfer torque (STT) and spin orbit torque (SOT).

The spin transfer torque is a phenomenon in which when current flows to structures to two different magnets are connected, torque (rotational force) is generated according to a relative magnetization direction of two magnetic layers.

The former spin interacts with an orbit motion and is referred to as spin-orbit coupling and the spin orbit torque is introduction of spin orbit coupling to a spin transfer torque phenomenon.

In the spin orbit torque, current spin polarized by a spin hall effect is injected into a ferromagnet in a heavy metal layer and a magnetic moment receives torque by misalignment of a direction of injected spin and a magnetic moment direction of the ferromagnet. As a result, the spin has the rotational force, and in this case, when damping torque against force to be rotated is cancelled by using an external magnetic field, the spin is subjected to a precession motion.

The spintronics based oscillator 200 according to the exemplary embodiment receives current and outputs an alternating signal by using the spin transfer torque or spin orbital torque.

More specifically, AC voltage generated by the precession motion is extracted to output a signal at a predetermined frequency.

The spintronics based oscillator 200 according to the exemplary embodiment may regard a current controlled oscillator (CCO) that determines a frequency by an input current amount.

Figure 3:
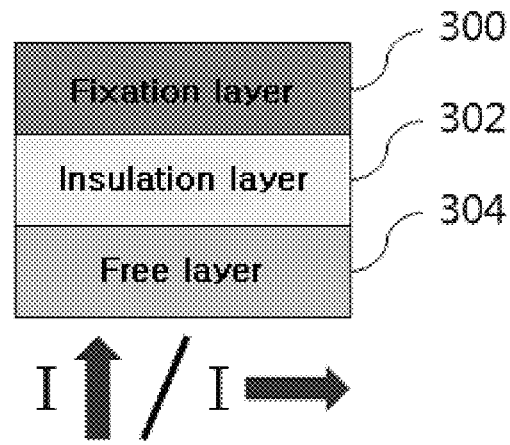
FIG. 3 is a diagram illustrating a spintronics based oscillator according to an exemplary embodiment of the present invention.

FIG. 3 is a diagram illustrating a spintronics based oscillator according to an exemplary embodiment of the present invention.

As illustrated in FIG. 3, the spintronics based oscillator 200 according to the exemplary embodiment may include a fixation layer 300, an insulation layer 302, and a free layer 304.

Here, a difference in spin direction between the fixation layer 300 and the free layer 304 may be expressed as θ and while θ is changed by a combination of external current and a magnetic field, the alternating signal may be derived.

In injecting the spin polarized current, the current may be vertically or horizontally applied and when the current is vertically applied, the free layer becomes an oscillation element using the spin transfer torque and when the current is horizontally applied, the free layer becomes an oscillation element using the spin orbit torque.

Here, the current may be horizontally applied to the free layer from an electrode made of the heavy metal.

Further, the detector 204 according to the exemplary embodiment is also configured by a spintronics based element.

In the spintronics based detector 204, the fixation layer 300 and the free layer 304 are configured by ferromagnets.

Further, the difference in spin direction between the fixation layer 300 and the free layer 304 may be expressed as θ.

Here, tunnel magnetoresistance (TMR) may be expressed as a function for θ.

In this case, when the current is applied to the free layer 304 and voltage values at both stages are read, the voltage values may be expressed as $V_{READ}=I*R(\theta)$ and a signal may be detected through $V_{READ}$.

Figure 4:
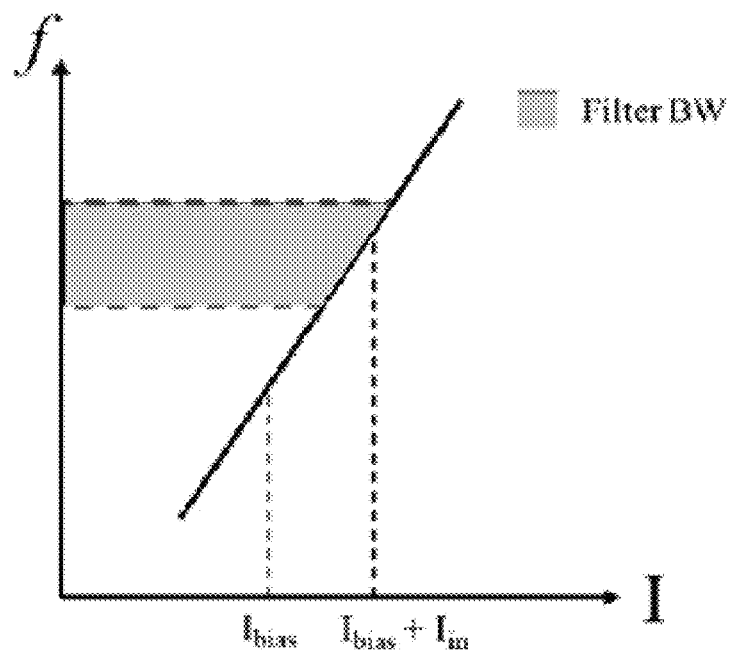
FIG. 4 is a diagram a frequency-current relationship according to the exemplary embodiment of the present invention.

FIG. 4 is a diagram a frequency-current relationship according to the exemplary embodiment of the present invention.

Referring to FIG. 4, it is assumed that responsivenesses of the bandpass filter 202 and the detector 204 are in a blue frequency band.

Here, in the detector 204, the bandpass filter is set to operate in a frequency band output when bias current and input current are simultaneously applied to the spintronics based oscillator and the detector 204 outputs the current according to the responsiveness by receiving an RF signal.

Bias current is input so as to operate in regions other than a blue region and when the bias current enters an operating region of the detector 204 by the input current, the detector 204 serves as a transimpedance amplifier that outputs output voltage according to the input current.

The transimpedance amplifier is determined according to current sensitivity of the spintronics based oscillator 200 and responsiveness of the spintronics based detector 204.

Further, the operating bandwidth is also determined according to the above condition.

Linearity of the amplifier is expected to be adjustable by shaping the bandpass filter.

The exemplary embodiment of the present invention is disclosed for the purpose of exemplification and it will be apparent to those skilled in the art that various modifications, additions, and substitutions are possible, without departing from the spirit and scope of the present invention as defined by the appended claims and the modifications, changes, and additions should be considered as falling within the scope of the following claims.

What is claimed is:

1. An ultra low power transimpedance amplifier based on spintronics, comprising:
   a spintronics based oscillator receiving current and outputting an alternating signal by using spin transfer torque or spin orbit torque;
   a bandpass filter passing a signal in a predetermined frequency band of the alternating signal output by the spintronics based oscillator; and
   a spintronics based detector outputting voltage by inputting the signal in the predetermined frequency band, which is output by the bandpass filter,
   wherein the spintronics based oscillator comprises:
   a fixation layer,
   an insulation layer, and
   a free layer having a spin direction difference of θ from the fixation layer, and
   outputs the alternating signal through current vertically or horizontally applied to the free layer.

2. The transimpedance amplifier of claim 1, wherein the spintronics based oscillator outputs the alternating signal by using the spin transfer torque when the current is vertically applied to the free layer.

3. The transimpedance amplifier of claim 1, wherein the spintronics based oscillator outputs the alternating signal by using the spin orbit torque when the current is horizontally applied from an electrode made a heavy metal connected to the free layer.

4. The transimpedance amplifier of claim 1, wherein the spintronics based detector comprises:
   a fixation layer,
   an insulation layer, and
   a free layer having a spin direction difference of θ from the fixation layer, and
   outputs voltage for input current according to the following equation:

$$V_{READ}=I*R(\theta)$$ [Equation].

5. The transimpedance amplifier of claim 1, wherein in the spintronics based detector, the bandpass filter is set to operate in a frequency band output when bias current and input current are simultaneously applied to the spintronics based oscillator.

* * * * *